United States Patent
Sawai

[19]

[11] Patent Number: 6,154,058
[45] Date of Patent: Nov. 28, 2000

[54] OUTPUT BUFFER

[75] Inventor: Yasunori Sawai, Tokyo, Japan

[73] Assignee: NEC Corporation, Tokyo, Japan

[21] Appl. No.: 09/324,327

[22] Filed: Jun. 2, 1999

[30] Foreign Application Priority Data

Apr. 6, 1998 [JP] Japan .................................. 10-155734

[51] Int. Cl.[7] .............................................. H03K 19/003
[52] U.S. Cl. .............................. 326/68; 326/24; 326/25; 326/26; 326/33; 326/34; 326/57
[58] Field of Search ................................. 326/68, 24, 25, 326/26, 33, 34, 57

[56] References Cited

U.S. PATENT DOCUMENTS

| 5,396,128 | 3/1995 | Dunning ..................................... 326/68 |
| 5,438,278 | 8/1995 | Wong et al. .............................. 326/27 |
| 5,500,610 | 3/1996 | Burstein .................................... 326/85 |
| 5,852,382 | 12/1998 | Lentini et al. .......................... 327/534 |
| 5,959,481 | 9/1999 | Donnelly et al. ....................... 327/170 |
| 6,005,413 | 12/1999 | Schmitt .................................... 326/80 |
| 6,040,711 | 3/2000 | Airaksinen et al. ..................... 326/81 |

FOREIGN PATENT DOCUMENTS

| 362161215A | 7/1987 | Japan . |
| 402119427A | 5/1990 | Japan . |
| 403169065A | 7/1991 | Japan . |
| 403259615A | 11/1991 | Japan . |
| 5-37169 | 2/1993 | Japan . |
| 405102405A | 4/1993 | Japan . |
| 409036720A | 2/1997 | Japan . |

*Primary Examiner*—Viet Q. Nguyen
*Attorney, Agent, or Firm*—Hayes, Soloway, Hennessey, Grossman & Hage, PC

[57] ABSTRACT

An output buffer includes a p-channel transistor, and first and second n-channel transistors. The p-channel transistor has one of a source and drain which is connected to power supply and the other which is connected to an output node connected to an output terminal. The first n-channel transistor has one of a source and drain which is grounded and the other which is connected to the output node. The second n-channel transistor is series-connected to the p-channel transistor between a power supply and the output node and receives at a gate a power supply potential level which rises at substantially the same time as the power supply upon ON operation.

7 Claims, 4 Drawing Sheets

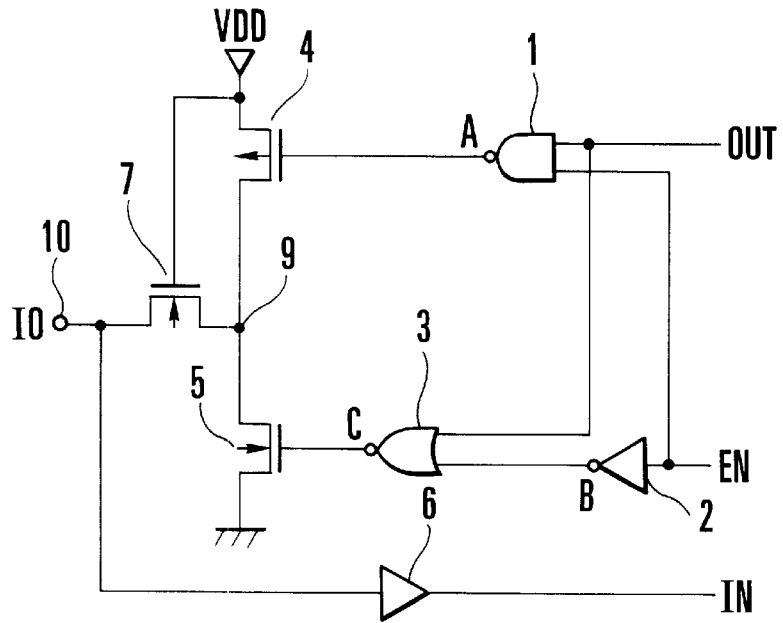
F I G. 1
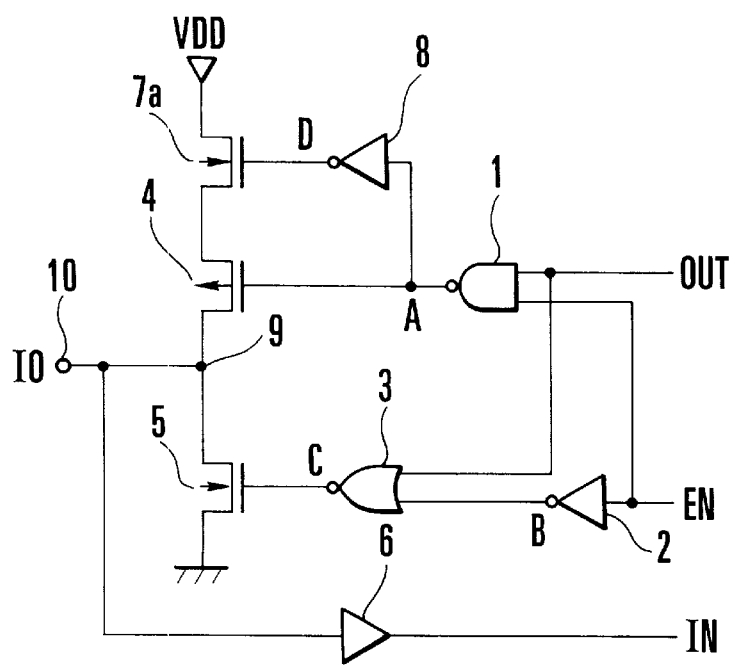
F I G. 2

OUTPUT BUFFER

BACKGROUND OF THE INVENTION

The present invention relates to an output buffer.

Conventionally, a communication interface between a computer and its peripheral device is established by providing input/output buffers on the bus lines.

FIG. 5 shows a conventional input/output P- and n-channel transistors 4 and 5 constitute an output buffer. A NAND circuit 1, inverter 2, and NOR circuit 3 constitute a circuit for controlling the output buffer. Table 1 shows normal operation of this input/output buffer.

TABLE 1

Normal Operation of Input/Output Buffer

| State | EN | OUT | A | B | C | Tr4 | Tr5 | IO | IN |
|---|---|---|---|---|---|---|---|---|---|
| 1 | 0 | x | H | H | L | Off | Off | Z | x |
| 2 | 0 | x | H | H | L | Off | Off | 1 | 1 |
| 3 | 0 | x | H | H | L | Off | Off | 0 | 0 |
| 4 | 1 | 1 | L | L | L | On | Off | 1 | 1 |
| 5 | 1 | 0 | H | L | H | Off | On | 0 | 0 |

In Table 1, EN denotes an enable signal for changing the output buffer to an enable state (an input buffer 6 to a disable state); OUT, a signal to be sent to a target device 51 such as a computer; IO, a signal appearing at an input/output terminal 10; IN, an output signal from the input buffer 6; A, an output signal from the NAND circuit 1; B, an output signal from the inverter 2; C, an output signal from the NOR circuit 3; Tr4 and Tr5, the states of transistors 4 and 5; "x", the absence of any signal input/output; and "Z", a high-impedance state.

The input/output buffer in FIG. 5 functions as an input buffer for an enable signal of "0" (states 1 to 3 in Table 1), and as an output buffer for an enable signal EN of "1" (states 4 and 5 in Table 1).

Operation when a board 52 having the input/output buffer is inserted into the target device 51 will be described. Assume that the target device 51 is a computer, and the board 52 having the input/output buffer is an interface board for connecting the computer and peripheral device. A power supply voltage VDD of the board 52 is supplied from the target device when the board 52 is inserted into the target device 51.

Table 2 shows operation of the input/output buffer immediately after the board 52 is inserted into the target device 51 while the target device 51 is ON.

TABLE 2

Operation of Input/Output Buffer Upon Inserting Hot Line

| State | EN | OUT | A | B | C | Tr4 | Tr5 | IO | IN |
|---|---|---|---|---|---|---|---|---|---|
| 6 | x | x | L | L | L | On | Off | H | x |

Table 2 shows the state before the power supply voltage VDD rises to a sufficient value. The output signal A from the NAND circuit 1, the output signal B from the inverter 2, and the output signal C from the NOR circuit 3 are at "L" level. Thus, the p-channel transistor 4 is turned on, whereas the n-channel transistor 5 is turned off.

When a terminal of the target device corresponding to the input/output terminal 10 of the board 52 is at "H" level, a large current I like the one shown in FIG. 5 flows from the target device 51 to power supply of the board 52 via the input/output terminal 10 and p-channel transistor 4.

This large current I may destruct a driver (output buffer) 53 of the target device 51 or a circuit (not shown) such as a regulator arranged on the power supply line of the board 52.

In this manner, the conventional input/output buffer may damage the circuit of the target device or the circuit of the board upon inserting a hot line. This problem does not occur in a target device which allows inserting the board after OFF operation. However, some target devices are difficult to turn off. Accordingly, there is provided a hot-line insertion/removal method capable of removing/inserting a board from/into a target device without turning off the target device such as a computer (e.g., Japanese Patent Laid-Open No. 5-37169).

FIG. 6 shows the arrangement of a hot-line insertion/removal method disclosed in Japanese Patent Laid-Open No. 5-37169. A backboard (corresponding to the target device 51 in FIG. 5) 43 allows mounting a plurality of circuit boards (corresponding to the board 52 in FIG. 5) 44. The backboard 43 has signal lines for connecting the circuit boards 44. The backboard 43 and each circuit board 44 respectively have connectors 11 and 38. The connector 11 comprises a ground pin 12, signal pin 13, and power supply pins 14 and 15. The ground pin 12 and power supply pin 14 are long pins, and the signal pin 13 and power supply pin 15 are short pins. In inserting the circuit board 44 into the backboard 43, the ground pin 12 and power supply pin 14 are connected to corresponding pins 39 and 41 of the backboard 43 earlier than the signal pin 13 and power supply pin 15, and in removal, connected later than the signal pin 13 and power supply pin 15.

The case in which the circuit board 44 is removed and to be inserted into the backboard 43 while the backboard 43 is ON will be explained.

When the circuit board 44 is inserted into the backboard 43, the ground pin 12 and power supply pin 14 of the circuit board 44 are connected to the corresponding pins 39 and 41 of the backboard 43. Upon connection, the power supply pin 14 receives power to operate a power-on clear circuit (PCLR) 20. The power-on clear circuit (PCLR) 20 sends an initialization signal of a predetermined period to an AND circuit 28. The output of the AND circuit 28 is connected to a reset terminal 31 of a flip-flop 29. If a signal at the reset terminal 31 is enabled, an output from an inverting output terminal 30 of the flip-flop 29 changes to "1". The output of the inverting output terminal 30 is connected to enable terminals 18 and 19 of output and input buffers 16 and 17 via an OR circuit 23. Since signals at the enable terminals 18 and 19 are "1", the outputs of the output and input buffers 16 and 17 change to a high-impedance state. Then, the output and input buffers 16 and 17 are disconnected from the backboard 43. At this time, an inverted output from the flip-flop 29 is input to a NOT circuit 36 to turn on a light-emitting diode 37, thereby representing a disconnected state.

The circuit board 44 is further inserted, the signal pin 13 and power supply pin 15 are connected to corresponding pins 40 and 42 of the backboard 43. The power supply pin 15 receives power to operate a power-on clear circuit (PCLR) 21. The power-on clear circuit (PCLR) 21 outputs an initialization signal of a predetermined period to the AND circuit 28. As a result, the reset terminal 31 of the flip-flop 29 is kept enabled until the initialization signal from the power-on clear circuit 21 is disabled, thereby inhibiting input of any signal from a switch 35. If the operator depresses the unlocked switch 35 upon completion of insertion of the circuit board 44, the depression signal is input to a clock terminal 33 of the flip-flop 29 via a switch chattering prevention (CHT) circuit 34. Until the depression signal is input to the clock terminal 33, an output from the inverting output terminal 30 is kept "1". Since the inverting output terminal 30 is connected to a data input terminal 32, the output from the inverting output terminal 30 changes to "0" upon reception of the depression signal at the clock terminal 33. Consequently, the enable signal terminals 18 and 19 of the output and input buffers 16 and 17 are enabled to connect the output and input buffers 16 and 17 to the backboard 43. Since the output from the inverting output terminal 30 of the flip-flop 29 is "0", the light-emitting diode 37 is turned off to represent a connected state.

This hot-line insertion/removal method disclosed in Japanese Patent Laid-Open No. 5-37169 can prevent destruction of the device upon inserting/removing a hot line. However, the circuit is complicated to increase the cost.

SUMMARY OF THE INVENTION

It is an object of the present invention to provide a simple buffer circuit capable of preventing destruction of a device upon inserting/removing a hot line.

To achieve the above object, according to the present invention, there is provided an output buffer comprising a p-channel transistor, one of a source and drain of which is connected to power supply and the other of which is connected to an output node connected to an output terminal, a first n-channel transistor, one of a source and drain of which is grounded and the other of which is connected to the output node, and a second n-channel transistor which is series-connected to the p-channel transistor between a power supply and the output node and receives at a gate a power supply potential level which rises at substantially the same time as the power supply upon ON operation.

BRIEF DESCRIPTION OF THE DRAWINGS

FIG. 1 is a circuit diagram showing an input/output buffer according to the first embodiment of the present invention;

FIG. 2 is a circuit diagram showing an input/output buffer according to the second embodiment of the present invention;

DESCRIPTION OF THE PREFERRED EMBODIMENTS

Figure 3:
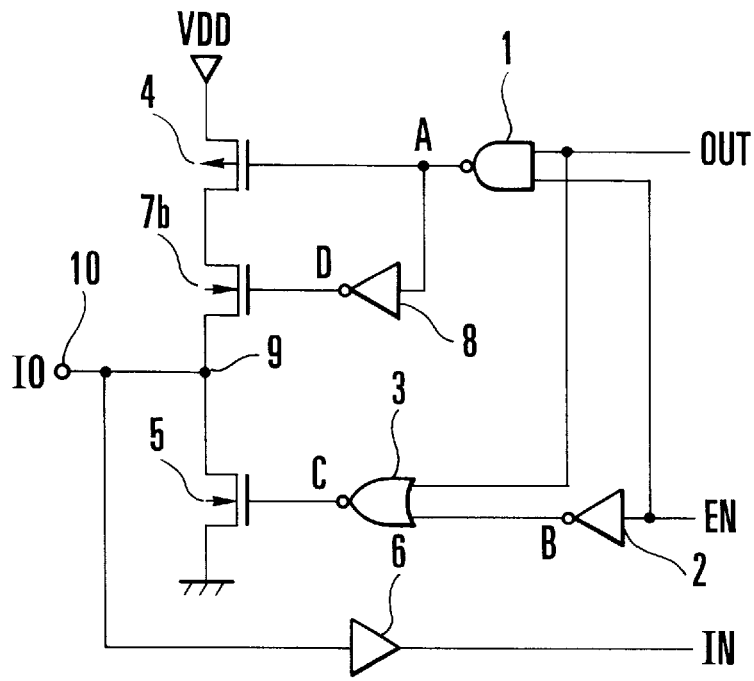
FIG. 3 is a circuit diagram showing an input/output buffer according to the third embodiment of the present invention.

Embodiments of the present invention will be described in detail below with reference to the accompanying drawings.
First Embodiment FIG. 1 shows an input/output buffer according to the first embodiment of the present invention. The same reference numerals as in FIG. 5 denote the same parts.

This input/output buffer comprises a NAND circuit 1 for NANDing a signal output OUT and enable signal EN to be sent to a target device (not shown) such as a computer, an inverter 2 for logically inverting the enable signal EN, a NOR circuit 3 for NORing the signal OUT and an output signal B from the inverter 2, a p-channel transistor 4, one of a source and drain of which is connected to power supply, the other of which is connected to an output node 9, and a gate of which receives an output signal A from the NAND circuit 1, a first n-channel transistor 5, one of a source and drain of which is grounded, the other of which is connected to the output node 9, and a gate of which receives an output signal C from the NOR circuit 3, an input buffer 6 having an input connected to an input/output terminal 10, and a second n-channel transistor 7, one of a source and drain of which is connected to the input/output terminal 10, the other of which is connected to the output node 9, and a gate of which receives a power supply voltage VDD.

Figure 5:
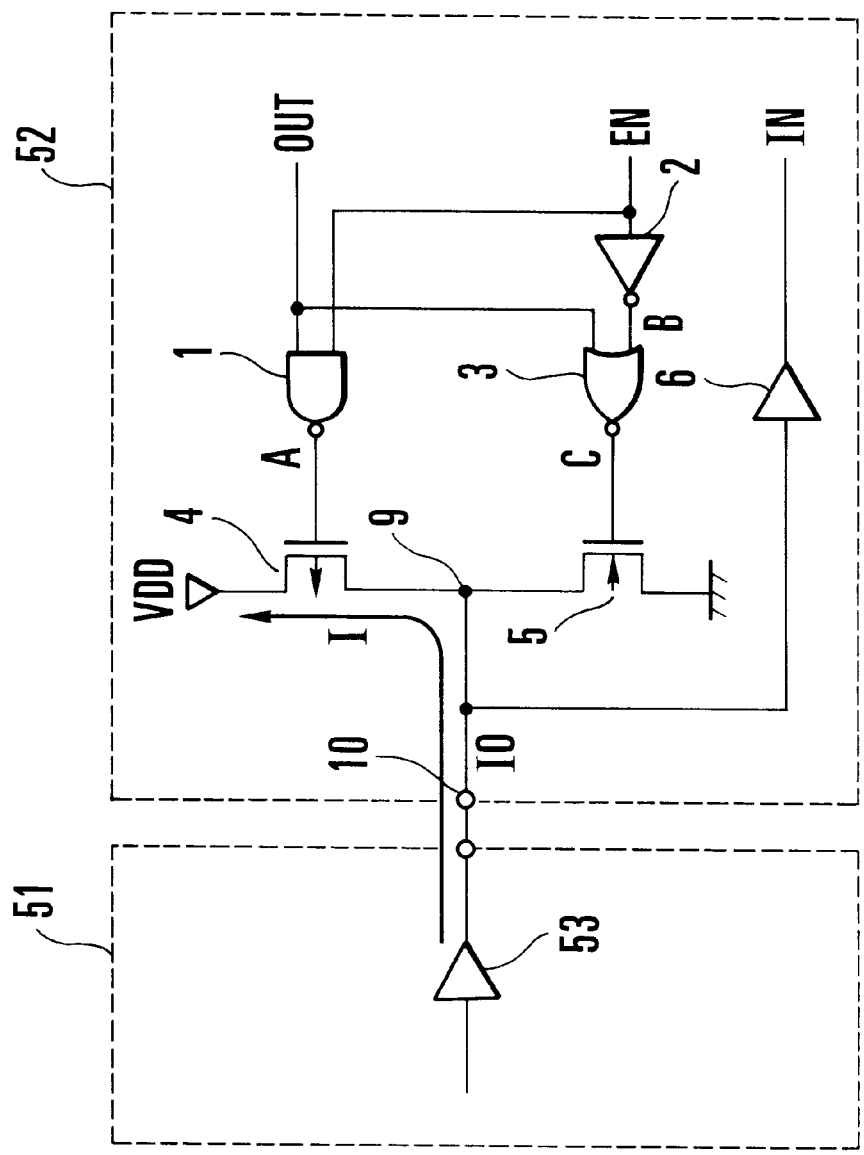
FIG. 5 is a circuit diagram showing a conventional input/output buffer.
Figure 6:
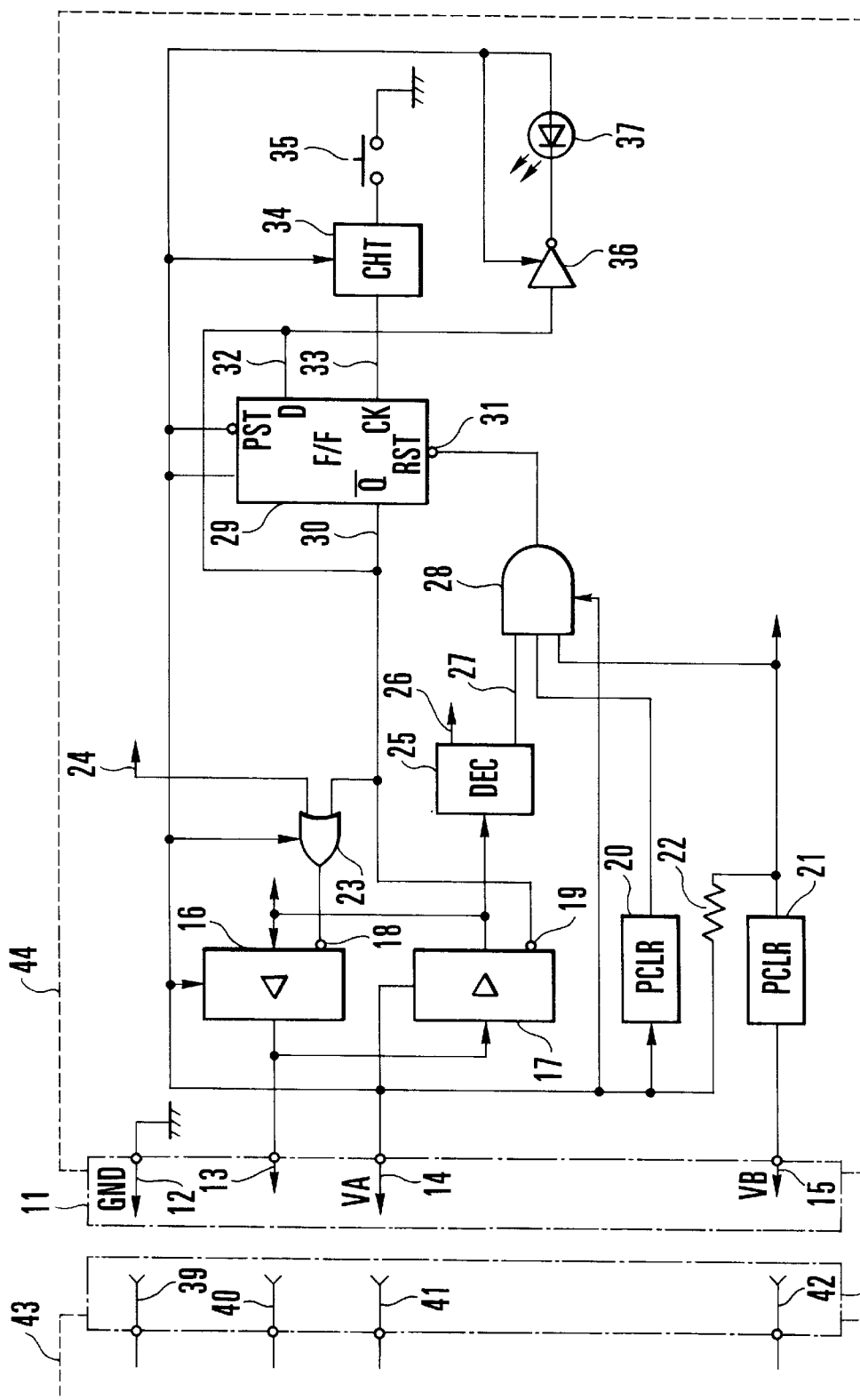
FIG. 6 is a block diagram showing the arrangement of a conventional hot-line insertion/removal method.

The input/output buffer of the first embodiment adds the n-channel transistor 7 between the input/output terminal 10 and output node 9 of the input/output buffer in FIG. 5. Table 3 shows normal operation of the input/output buffer of the first embodiment.

TABLE 3

Normal Operation of Input/Output Buffer

| State | EN | OUT | A | B | C | Tr4 | Tr5 | Tr7 | IO | IN |
|---|---|---|---|---|---|---|---|---|---|---|
| 1 | 0 | x | H | H | L | Off | Off | On | Z | x |
| 2 | 0 | x | H | H | L | Off | Off | On | 1 | 1 |
| 3 | 0 | x | H | H | L | Off | Off | On | 0 | 0 |
| 4 | 1 | 1 | L | L | L | On | Off | On | 1 | 1 |
| 5 | 1 | 0 | H | L | H | Off | On | On | 0 | 0 |

In Table 3, Tr7 denotes the state of the transistor 7, and the remaining symbols denote the same as in Table 1.

Since the gate of the n-channel transistor 7 is connected to the power supply, the transistor 7 is always ON in normal operation in which the power supply voltage VDD is normally supplied. With this operation, the input/output buffer of the first embodiment realizes the same function as the input/output buffer in FIG. 5.

Operation when a board having the input/output buffer in FIG. 1 is inserted into a target device (not shown) will be described. Assume that the target device is a computer, and the board having the input/output buffer is an interface board for connecting the computer and peripheral device. The power supply voltage VDD of the board is supplied from the target device when the board is inserted into the target device.

Table 4 shows operation of the input/output buffer immediately after the board is inserted into the target device while the target device is ON.

TABLE 4

Operation of Input/Output Buffer Upon Inserting Hot Line

| State | EN | OUT | A | B | C | Tr4 | Tr5 | Tr7 | IO | IN |
|---|---|---|---|---|---|---|---|---|---|---|
| 6 | x | x | L | L | L | On | Off | Off | H | x |

Table 4 shows the state before the power supply voltage VDD rises to a sufficient value. The output signal A from the NAND circuit 1, the output signal B from the inverter 2, and the output signal C from the NOR circuit 3 are at "L" level. Thus, the p-channel transistor 4 is turned on, whereas the n-channel transistor 5 is turned off.

A delay time, although short, exists at a time interval required for the power supply voltage VDD to rise to a normal value after inserting the board into the target device. This is because of the presence of a regulator (not shown) on the power supply line of the board and the presence of an inductance component on the power supply line.

The n-channel transistor 7 is kept off until the power supply voltage VDD reaches the threshold voltage, as shown in Table 4.

Even if, therefore, a terminal of the target device corresponding to the input/output terminal 10 of the board is at "H" level in inserting the board into the target device, no large current I like the one in FIG. 5 flows from the target device.

When the n-channel transistor 7 is turned on, the power supply voltage VDD has risen to a sufficient value, and no large current I flows from the target device. Since the input of the input buffer 6 is at a high impedance, no large current flows into the input buffer 6.

By forming the n-channel transistor 7 between power supply and the input/output terminal 10, the board can be inserted into the target device without damaging the circuits of the target device and board, and destruction of the device in inserting/removing a hot line can be prevented with a simple arrangement.

Second Embodiment

FIG. 2 shows an input/output buffer according to the second embodiment of the present invention.

The second embodiment adopts, instead of the n-channel transistor 7, an n-channel transistor 7a, one of a source and drain of which is connected to a power supply and the other of which is connected to the source or drain of a p-channel transistor 4, and an inverter 8 for supplying a signal obtained by logically inverting an output signal A from a NAND circuit 1 to the gate of the n-channel transistor 7a. Table 5 shows normal operation of the input/output buffer.

TABLE 5

Normal Operation of Input/Output Buffer

| State | EN | OUT | A | B | C | D | Tr4 | Tr5 | Tr7a | IO | IN |
|---|---|---|---|---|---|---|---|---|---|---|---|
| 1 | 0 | x | H | H | L | L | Off | Off | Off | z | x |
| 2 | 0 | x | H | H | L | L | Off | Off | Off | 1 | 1 |
| 3 | 0 | x | H | H | L | L | Off | Off | Off | 0 | 0 |
| 4 | 1 | 1 | L | L | L | H | On | Off | On | 1 | 1 |
| 5 | 1 | 0 | H | L | H | L | Off | On | Off | 0 | 0 |

In Table 5, D denotes an output signal from the inverter 8; and Tr7a, the state of the transistor 7a. The remaining symbols denote the same as in Table 1.

The gate of the n-channel transistor 7a is connected to the gate input (output signal A from the NAND circuit 1) of the p-channel transistor 4 via the inverter 8. In an input mode (states 1 to 3 in Table 5) having an enable signal EN of "0", the transistor 7a is turned off. In an output mode (states 4 and 5 in Table 5) having an enable signal EN of "1", the transistor 7a is turned on for a signal OUT of "1" and off for a signal OUT of "0". With this operation, the input/output buffer realizes the same function as the input/output buffer in FIG. 5.

Operation when a board having the input/output buffer in FIG. 2 is inserted into a target device (not shown) will be described similarly to the first embodiment. Table 6 shows operation of the input/output buffer immediately after the board is inserted into the target device while the target device is ON.

TABLE 6

Operation of Input/Output Buffer Upon Inserting Hot Line

| State | EN | OUT | A | B | C | D | Tr4 | Tr5 | Tr7a | IO | IN |
|---|---|---|---|---|---|---|---|---|---|---|---|
| 6 | x | x | L | L | L | L | On | Off | Off | H | x |

Table 6 shows the state before the power supply voltage VDD rises to a sufficient value. Similar to the first embodiment, the p-channel transistor 4 is turned on, whereas the n-channel transistor 5 is turned off.

Since the output signal D from the inverter 8 is kept at "L" level until the power supply voltage VDD reaches a predetermined value, the n-channel transistor 7a is turned off. Consequently, the same effects as in the first embodiment can be obtained.

Third Embodiment

FIG. 3 shows an input/output buffer according to the third embodiment of the present invention.

The third embodiment adopts, instead of the n-channel transistor 7, an n-channel transistor 7b, one of a source and drain of which is connected to the source or drain of a p-channel transistor 4 and the other of which is connected to an output node 9, and an inverter 8 for supplying a signal obtained by logically inverting an output signal A from a NAND circuit 1 to the gate of the transistor 7b.

Operation of this input/output buffer is the same as operation of the input/output buffer according to the second embodiment shown in Tables 5 and 6 in both normal state and insertion of a hot line. The same effects as in the first embodiment can be obtained.

The input/output buffer of the third embodiment can prevent generation of a leakage current flowing through the semiconductor substrate of the p-channel transistor 4 upon inserting a hot line.

Figure 4A:
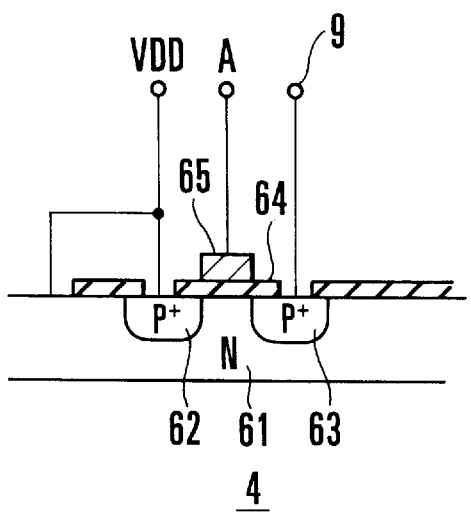
FIGS. 4A and 4B are sectional views, respectively, showing a p-channel transistor in FIGS. 1 and 2 and a second n-channel transistor in FIG. 3.

That is, as shown in FIG. 4A, the p-channel transistor 4 is formed from an n-type Si substrate 61, $p^+$-type Si source region 62, $p^+$-type Si drain region 63, oxide film 64 serving as a gate insulating film, and poly-Si gate electrode 65. Upon inserting a hot line, a leakage current flows through the substrate 61.

Figure 4B:
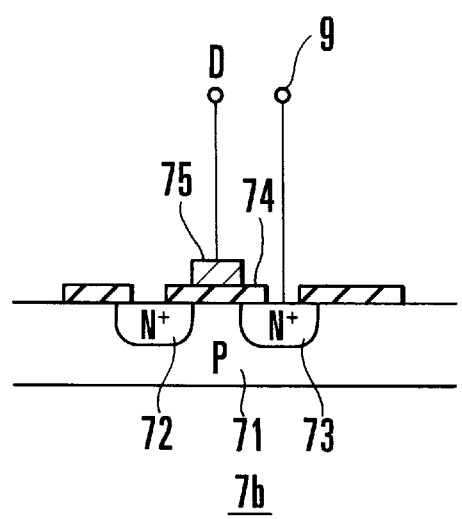

To the contrary, as shown in FIG. 4B, the n-channel transistor 7b is formed from a p-type Si substrate 71, $n^+$-type Si source region 72, $n^+$-type Si drain region 73, oxide film 74 serving as a gate insulating film, and poly-Si gate electrode 75. This transistor 7b can be formed between the p-channel transistor 4 and output node 9 to prevent generation of any leakage current.

Fourth Embodiment

The n-channel transistors 7, 7a, and 7b are of an enhancement type in the first to third embodiments, but may be of a depletion (undoped) type.

If the depletion type n-channel transistors 7, 7a, and 7b are used, the drain-source voltage in an ON state becomes lower than in the enhancement type transistors, and the influence on normal operation of the input/output buffer can be reduced.

The depletion type transistor has normally on characteristics. Since an ON resistance of about 100 kΩ exists, no large current flows upon inserting a hot line.

Note that the enable signal EN is input to the gate of the n-channel transistor 7a or 7b via the NAND circuit 1 and inverter 8 in the second or third embodiment, but may be directly input to the gate.

In the first to fourth embodiments, insertion of a hot line is exemplified by inserting the board into the target device while the target device is ON. However, the above-described problem occurs even when, e.g., different power supply voltages are used within a single circuit board, and a voltage higher than the power supply voltage VDD of the input/output buffer first rises to be applied to the input/output terminal 10. Also in this case, the present invention can be applied to prevent destruction of the device.

What is claimed is:

1. An output buffer comprising:

a p-channel transistor, one of a source and drain of which is connected to power supply and the other of which is connected to an output node connected to an output terminal;

a first n-channel transistor, one of a source and drain of which is grounded and the other of which is connected to the output node; and a second n-channel transistor which is series-connected to said p-channel transistor between a power supply and the output node and receives at a gate a power supply potential level which rises at substantially the same time as said power supply upon ON operation.

2. An output buffer comprising:

a p-channel transistor, one of a source and drain of which is connected to power supply and the other of which is connected to an output node connected to an output terminal;

a first n-channel transistor, one of a source and drain of which is grounded and the other of which is connected to the output node; and a second n-channel transistor which is series-connected to said p-channel transistor between power supply and the output node and receives at a gate a control signal for activating said output buffer.

3. A buffer according to claim 1, wherein said second n-channel transistor is formed between the output terminal and output node and has a gate connected to said power supply.

4. A buffer according to claim 2, wherein said output buffer further comprises an inverter for inverting a gate input of said p-channel transistor and supplying the inverted input to the gate of said second n-channel transistor, and said second n-channel transistor is formed between said power supply and said p-channel transistor.

5. A buffer according to claim 2, wherein said output buffer further comprises an inverter for inverting a gate input of said p-channel transistor and supplying the inverted input to the gate of said second n-channel transistor, and said second n-channel transistor is formed between said p-channel transistor and the output node.

6. A buffer according to claim 1, wherein said second n-channel transistor is a depletion type transistor.

7. A buffer according to claim 2, wherein said second n-channel transistor is a depletion type transistor.

* * * * *